United States Patent
Yu et al.

(10) Patent No.: US 10,297,602 B2
(45) Date of Patent: May 21, 2019

(54) IMPLANTATIONS FOR FORMING SOURCE/DRAIN REGIONS OF DIFFERENT TRANSISTORS

(71) Applicant: Taiwan Semiconductor Manufacturing Company, Ltd., Hsinchu (TW)

(72) Inventors: Dian-Sheg Yu, Hsinchu (TW); Jhon Jhy Liaw, Zhudong Township (TW); Ren-Fen Tsui, Yungho (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/598,825

(22) Filed: May 18, 2017

(65) Prior Publication Data

US 2018/0337188 A1 Nov. 22, 2018

(51) Int. Cl.
*H01L 27/11* (2006.01)
*H01L 21/265* (2006.01)
(Continued)

(52) U.S. Cl.
CPC .... *H01L 27/1104* (2013.01); *H01L 21/26513* (2013.01); *H01L 21/30604* (2013.01);
(Continued)

(58) Field of Classification Search
CPC ........... H01L 27/1104; H01L 21/26513; H01L 21/30604; H01L 21/76802; H01L 21/823814; H01L 21/823821; H01L 21/823828; H01L 21/823864; H01L 21/823871; H01L 27/0203; H01L 29/0847; H01L 29/665; H01L 29/66545; H01L 29/66636
See application file for complete search history.

(56) References Cited

U.S. PATENT DOCUMENTS

| | | | |
|---|---|---|---|
| 9,576,908 | B1 | 2/2017 | Lin et al. |
| 9,577,101 | B2 | 2/2017 | Ching et al. |
| 9,607,838 | B1 | 3/2017 | Lin et al. |
| 2015/0008538 | A1* | 1/2015 | Nandakumar .. H01L 21/823418 257/408 |

(Continued)

FOREIGN PATENT DOCUMENTS

| | | |
|---|---|---|
| TW | 201633540 A | 9/2016 |
| TW | 201703122 A | 1/2017 |

(Continued)

*Primary Examiner* — Thanh T Nguyen
(74) *Attorney, Agent, or Firm* — Slater Matsil, LLP

(57) ABSTRACT

A method includes forming a first transistor including forming a first gate stack, epitaxially growing a first source/drain region on a side of the first gate stack, and performing a first implantation to implant the first source/drain region. The method further includes forming a second transistor including forming a second gate stack, forming a second gate spacer on a sidewall of the second gate stack, epitaxially growing a second source/drain region on a side of the second gate stack, and performing a second implantation to implant the second source/drain region. An inter-layer dielectric is formed to cover the first source/drain region and the second source/drain region. The first implantation is performed before the inter-layer dielectric is formed, and the second implantation is performed after the inter-layer dielectric is formed.

20 Claims, 19 Drawing Sheets

(51) Int. Cl.
    *H01L 21/306*     (2006.01)
    *H01L 21/768*     (2006.01)
    *H01L 21/8238*     (2006.01)
    *H01L 27/02*     (2006.01)
    *H01L 29/08*     (2006.01)
    *H01L 29/66*     (2006.01)
    *H01L 27/092*     (2006.01)

(52) U.S. Cl.
    CPC ........... *H01L 21/76802* (2013.01); *H01L 21/823814* (2013.01); *H01L 21/823821* (2013.01); *H01L 21/823828* (2013.01); *H01L 21/823864* (2013.01); *H01L 21/823871* (2013.01); *H01L 27/0203* (2013.01); *H01L 29/0847* (2013.01); *H01L 29/665* (2013.01); *H01L 29/66545* (2013.01); *H01L 29/66636* (2013.01); *H01L 27/0922* (2013.01); *H01L 27/0924* (2013.01); *H01L 27/0928* (2013.01)

(56) References Cited

U.S. PATENT DOCUMENTS

2016/0141384 A1*   5/2016   Lee .................... H01L 29/7833
                                                                                     438/275
2016/0197074 A1    7/2016   Lee et al.
2017/0005165 A1    1/2017   Chen et al.

FOREIGN PATENT DOCUMENTS

TW         201711158 A     3/2017
TW         201712763 A     4/2017

\* cited by examiner

IMPLANTATIONS FOR FORMING SOURCE/DRAIN REGIONS OF DIFFERENT TRANSISTORS

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, three-dimensional transistors such as a Fin Field-Effect Transistors (FinFETs) have been introduced to replace planar transistors. Although existing FinFET devices and methods of fabricating FinFET devices have been generally adequate for their intended purposes, more problems emerge with the increasing downscaling of circuits. For example, the FinFETs for different circuits such as core (logic) circuits, Static Random Access Memory (SRAM) circuits, and Input-Output devices may face different problems with the increasing downscaling of integrated circuits, which problems were not observed before.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
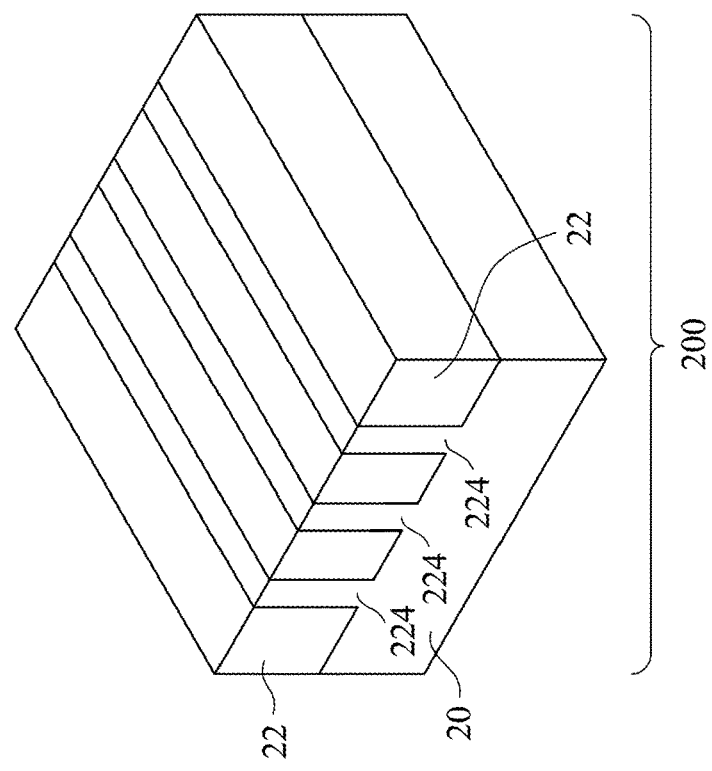
FIGS. 1 through 15 illustrate the cross-sectional views and perspective views of intermediate stages in the formation of Fin Field-Effect Transistors (FinFETs) in accordance with some embodiments.
Figure 1:
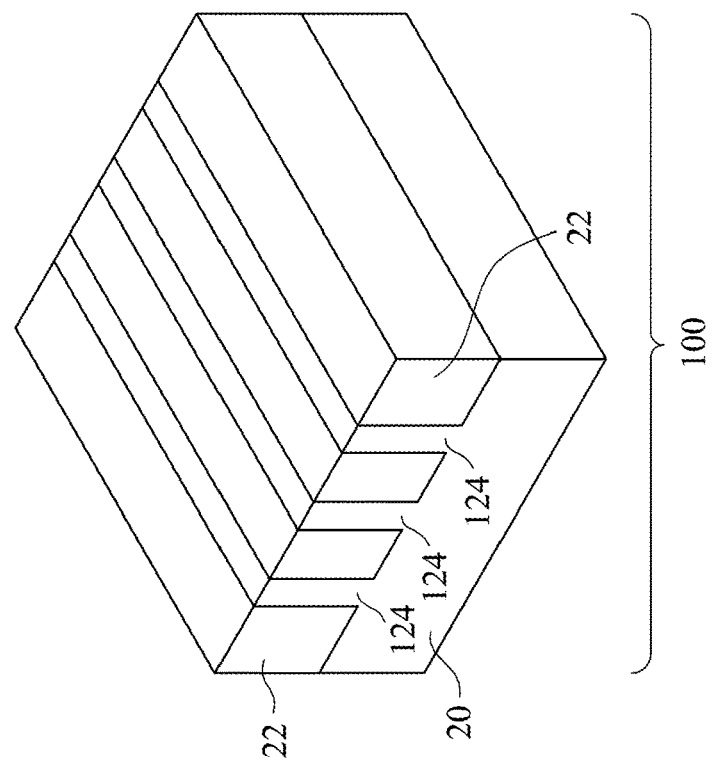

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concepts of the present disclosure. Planar transistors may also adopt the concept of the present disclosure.

Figure 16:
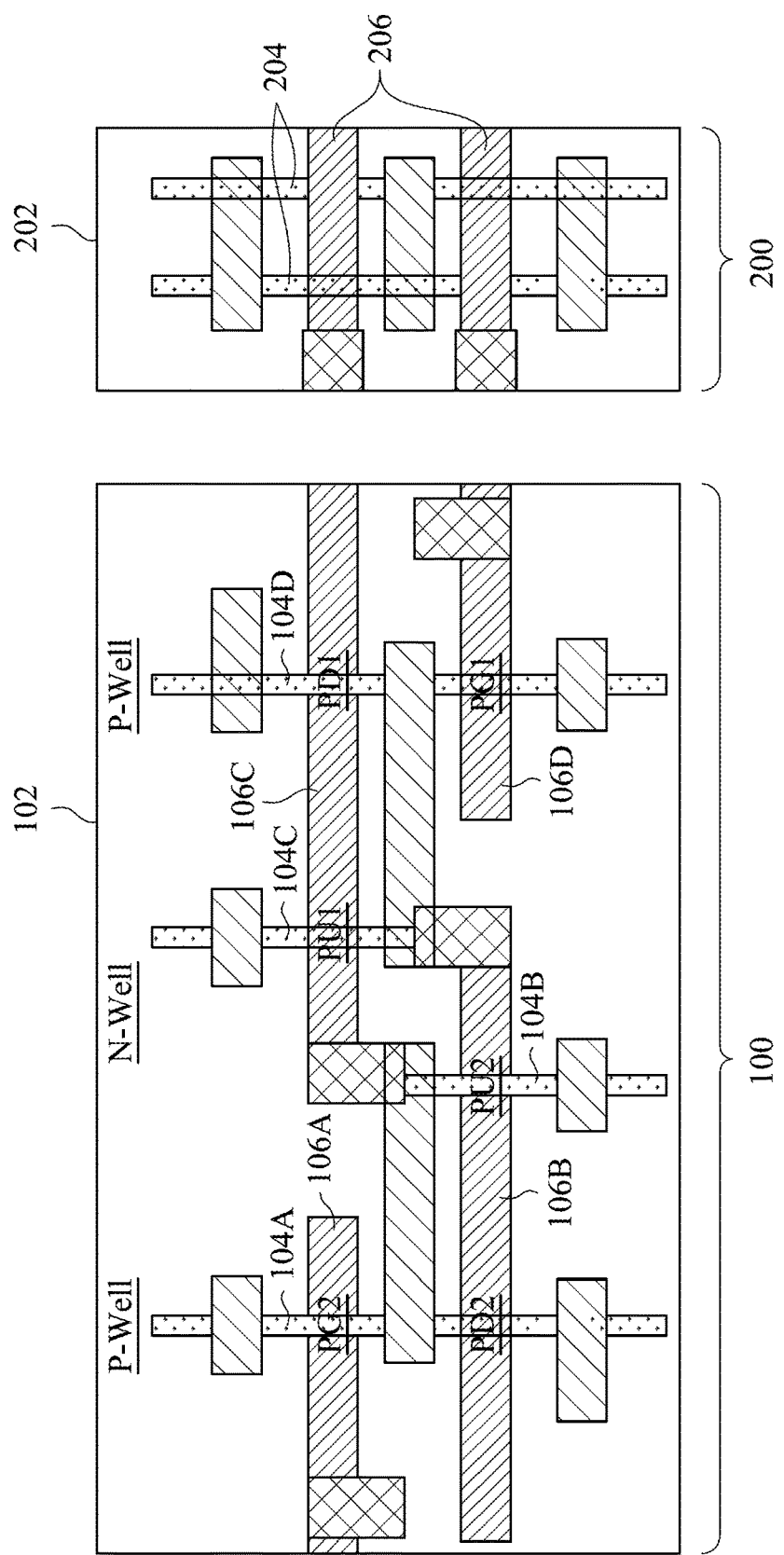
FIG. 16 illustrates the layout of some circuits in accordance with some embodiments.

FIG. 16 illustrates an exemplary layout of circuits in device regions 100 and 200. Throughout the description, device region 100 is a region in which long-channel transistors are formed, and device region 200 is a region in which short-channel transistors are formed. It is appreciated that the terms "long-channel" and "short-channel" are relative to each other. The long-channel transistors have channels longer than the channels of short channel transistors. In accordance with some embodiments of the present disclosure, the long-channel device region 100 include Static Random Access Memory (SRAM) cells or Input-Output (IO) circuits, and the transistors therein are long-channel transistors. The short-channel device region 200 may include logic circuits/transistors (sometimes referred to as core circuits/transistors), and the transistors therein are short-channel transistors. For example, FIG. 16 illustrates an SRAM cell 102 in device region 100. In accordance with alternative embodiments, device region 100 includes an IO transistor(s). SRAM cell 102 includes p-type transistors PU1 and PU2 formed in an N-well, and n-type transistors PD1, PD2, PG1, and PG2 formed in P-wells. Transistors PU1, PU2, PD1, PD2, PG1, and PG2 are formed based on active regions (which may be semiconductor fins) 104A, 104B, 104C, and 104D and gate electrodes 106A, 106B, 106C, and 106D. Transistor 202 is in device region 200, and is formed based on active regions (which may also be semiconductor fins) 204 and gate electrodes 206. Transistor 202 may be a p-type transistor or an n-type transistor.

Figure 15:
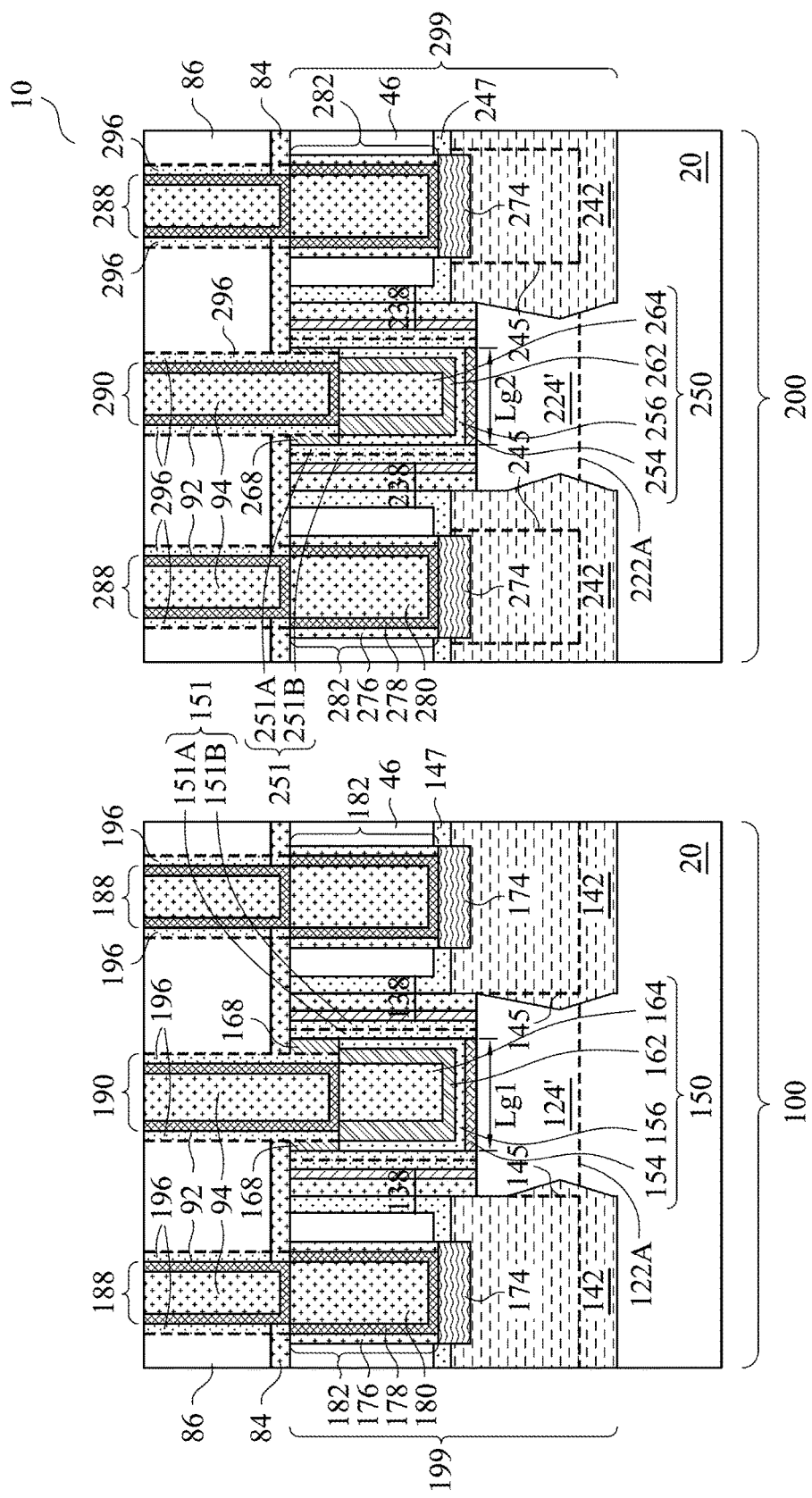

In accordance with some embodiments of the present disclosure, as shown in FIG. 15, the channel-length Lg2 of the short-channel device is smaller than about 30 nm, and the channel-length Lg1 of the long-channel device is greater than about 60 nm. The ratio Lg1/Lg2 may be greater than about 2.0 in accordance with some embodiments, and may be in the range between about 2 and about 10.

Figure 17:
FIG. 17 illustrates a process flow for forming FinFETs in accordance with some embodiments.

FIGS. 1 through 15 illustrate the cross-sectional views and perspective views of intermediate stages in the formation of transistors in accordance with some embodiments of the present disclosure. The steps shown in FIGS. 1 through 15 are also reflected schematically in the process flow 300 shown in FIG. 17. The formed transistors include a long-channel transistor (such as a long-channel FinFET as an example) in device region 100 and a short-channel transistor (such as a short-channel FinFET as an example) in device region 200. In accordance with some exemplary embodiments of the present disclosure, the long-channel transistor and the short-channel transistor in device regions 100 and 200, respectively, are of a same conductivity type, and may be both p-type transistors or both n-type transistors. For example, the long-channel transistor formed in device region 100 may be a p-type transistor such as transistor PU1 or PU2 in FIG. 16, an n-type transistor such as transistor PD1, PD2, PG1, or PG2 in FIG. 16, or a p-type or n-type transistor in an IO circuit. The short-channel transistor formed in device region 200 may be either a p-type transistor or an n-type transistor, with the layout illustrated in FIG. 16.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend into substrate 20. The portions of substrate 20 between neighboring STI regions 22 are referred to as semiconductor strips 124 and 224, which are in device regions 100 and 200, respectively.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on coating, or the like.

Figure 2:
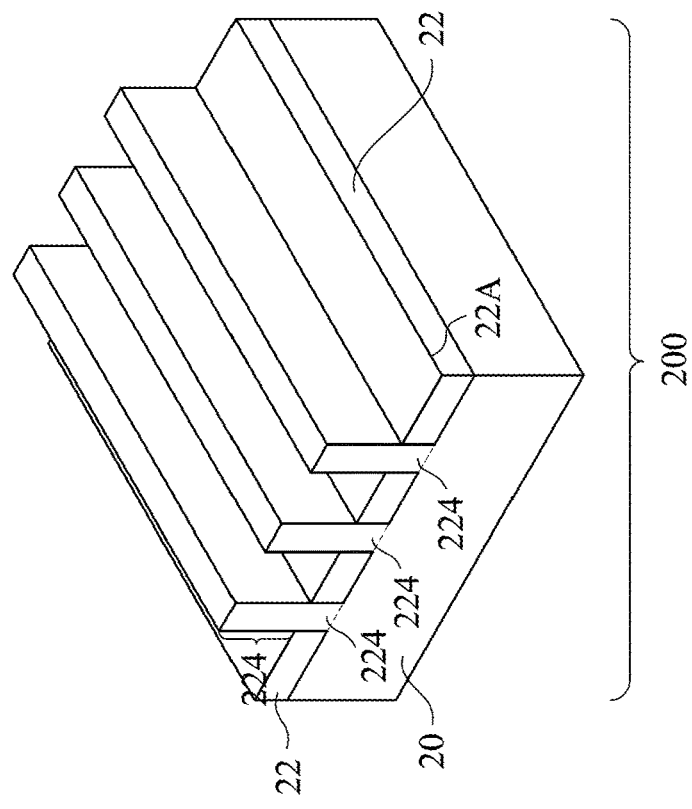
Figure 2:
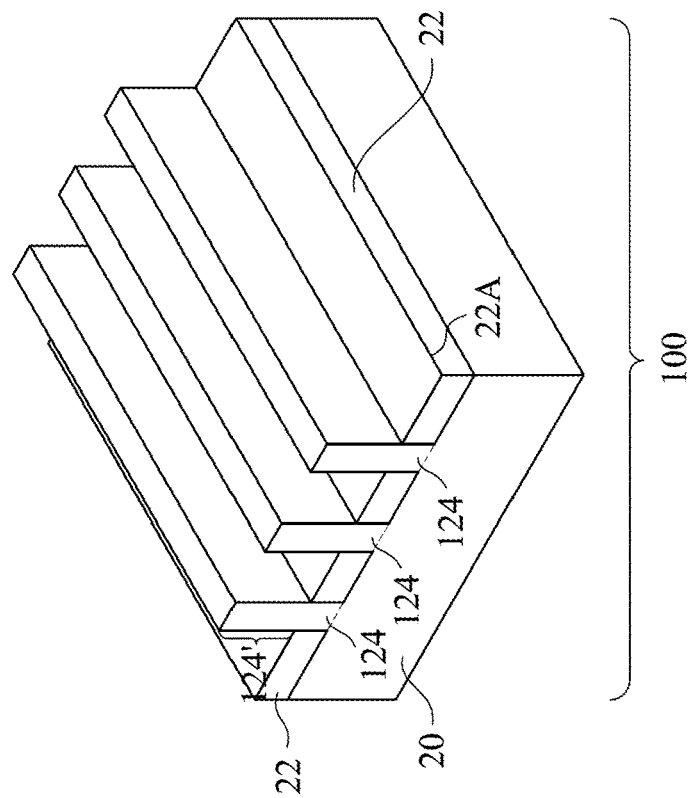

Referring to FIG. 2, STI regions 22 are recessed, so that the top portions of semiconductor strips 124 and 224 protrude higher than the top surfaces 22A of the neighboring STI regions 22 to form protruding fins 124' and 224'. The respective step is illustrated as step 302 in the process shown in FIG. 17. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of STI regions 22 is performed using a wet etch process. The etching chemical may include diluted HF, for example.

Figure 3:
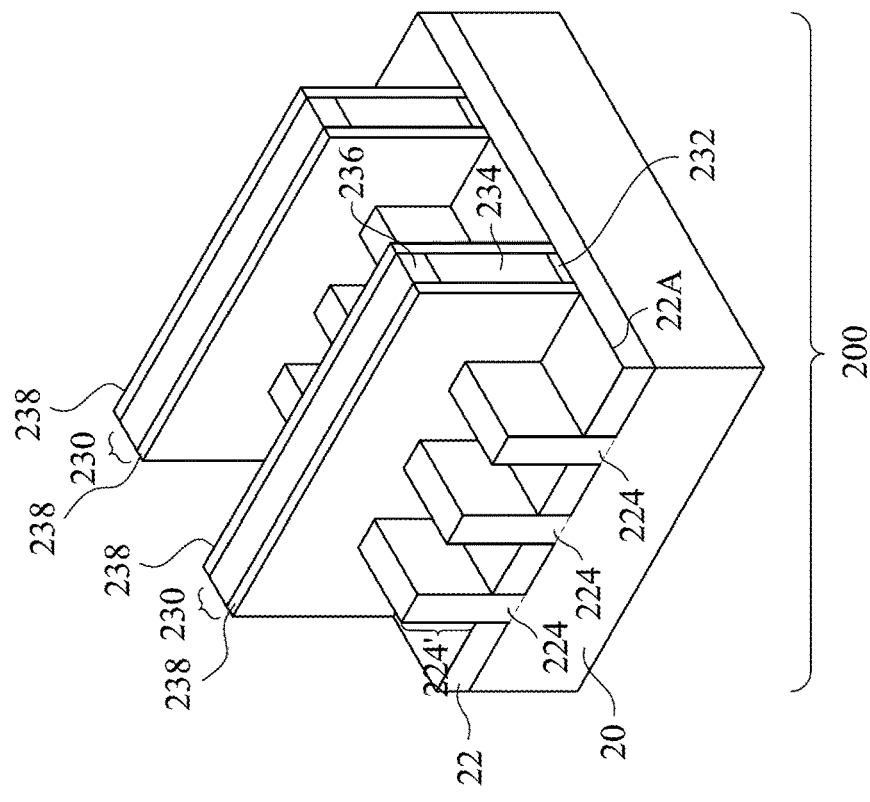
Figure 3:
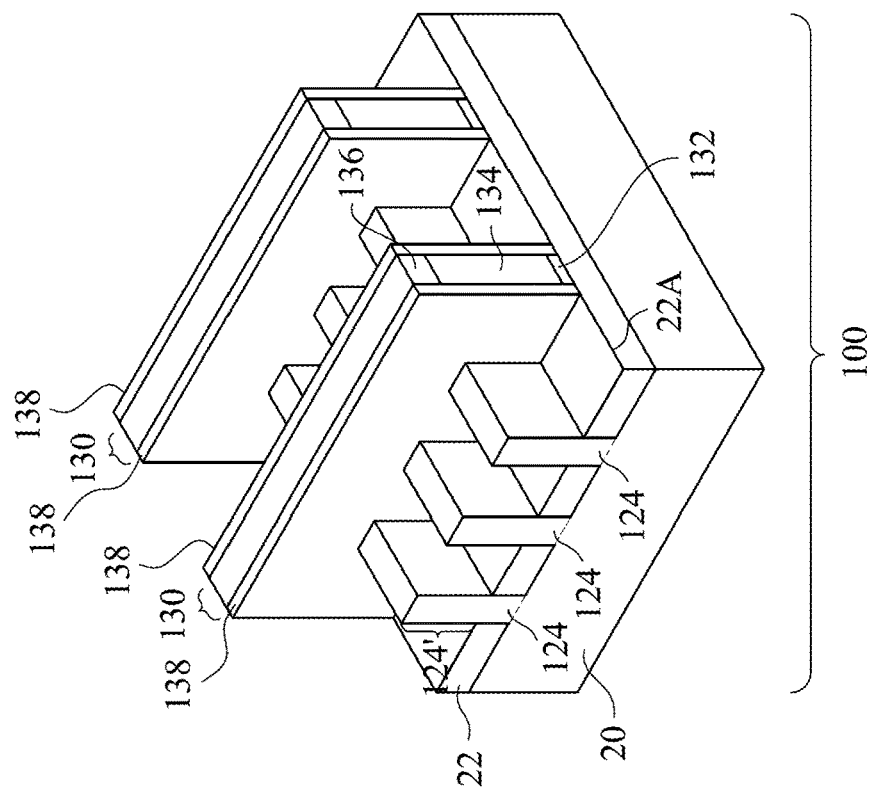

Referring to FIG. 3, dummy gate stacks 130 and 230 are formed on the top surfaces and the sidewalls of protruding fins 124' and 224', respectively. The respective step is illustrated as step 304 in the process shown in FIG. 17. Dummy gate stacks 130 may include gate dielectrics 132 and dummy gate electrodes 134 over dummy gate dielectrics 132. Dummy gate stacks 230 may include gate dielectrics 232 and dummy gate electrodes 234 over dummy gate dielectrics 232. Dummy gate electrodes 134 and 234 may be formed, for example, using polysilicon, and other materials may also be used. Each of dummy gate stacks 130 and 230 may also include one (or a plurality of) hard mask layers 136 and 236. Hard mask layers 136 and 236 may be formed of silicon nitride, silicon carbo-nitride, or the like. Each of dummy gate stacks 130 and 230 crosses over a single one or a plurality of protruding fins 124' and 224', respectively. Dummy gate stacks 130 and 230 may also have lengthwise directions perpendicular to the lengthwise directions of the respective protruding fins 124' and 224', respectively.

Next, gate spacers 138 and 238 are formed on the sidewalls of dummy gate stacks 130 and 230, respectively. In the meantime, fin spacers (not shown) may also be formed on the sidewalls of protruding fins 124' and 224' respectively. In accordance with some embodiments of the present disclosure, gate spacers 138 and 238 are formed of a dielectric material(s) such as silicon carbon-oxynitride (SiCN), silicon nitride, or the like, and may have a single-layer structure or a multi-layer structure including a plurality of dielectric layers.

In accordance with some embodiments, each of gate spacers 138 includes a low-k dielectric layer 138A and a non-low-k dielectric layer 138B (refer to FIG. 6B), with each of layers 138A and 138B formed through a blanket deposition step followed by an anisotropic etching step. Low-k dielectric layer 138A may be formed of a low-k dielectric material having a dielectric constant (k value) lower than about 3.0, which may be formed of SiON or SiOCN, with pores formed therein in order to reduce its k value. Non-low-k dielectric layer 138B may be formed of silicon nitride, for example. Gate spacers 238 have the same structure as gate spacers 138, and may include layers 238A and 238B formed of the same materials as layers 138A and 138B, respectively.

Figure 4:
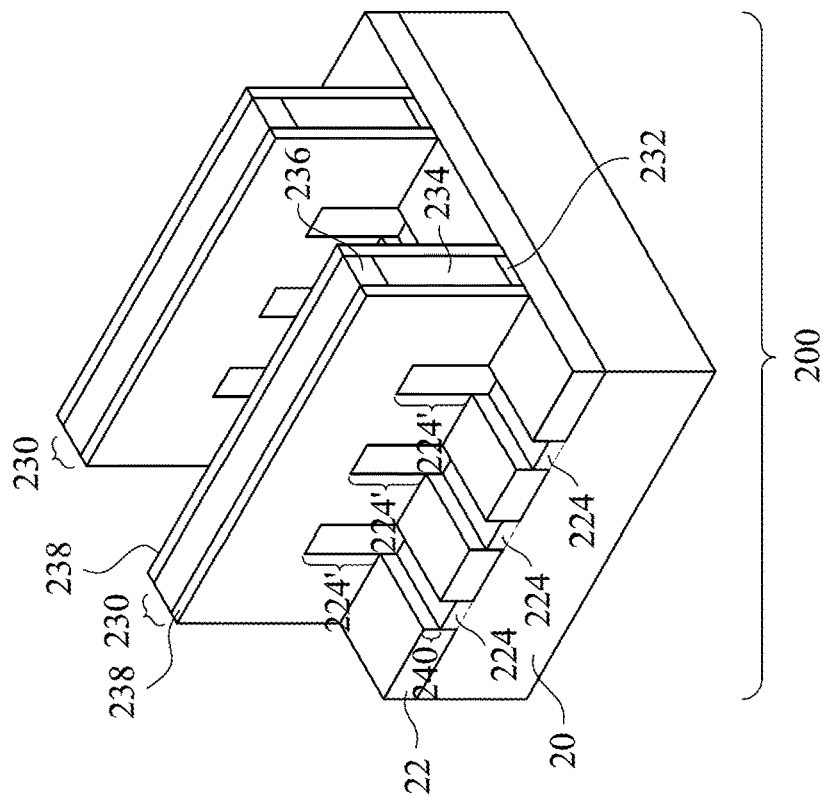
Figure 4:
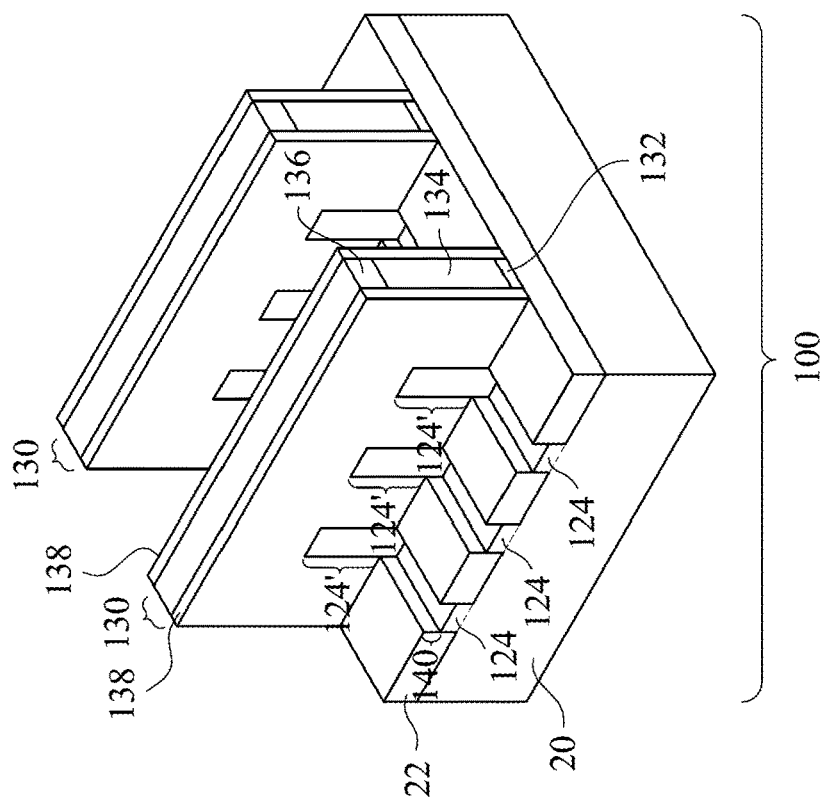

An etching step (referred to as source/drain recessing hereinafter) is then performed to etch the portions of protruding fins 124' and 224' (and the underlying portions of strips 124 and 224) that are not covered by dummy gate stacks 130 and 230 and gate spacers 138 and 238, resulting in the structure shown in FIG. 4. The recessing may be anisotropic, and hence the portions of fins 124' and 224' directly underlying the respective dummy gate stack 130/230 and gate spacers 138/238 are protected, and are not etched. The top surfaces of the recessed semiconductor strips 124 and 224 may be lower than the top surfaces of the adjacent STI regions 22 in accordance with some embodiments. Recesses 140 and 240 are accordingly formed between STI regions 22. The recessing in device regions 100 and 200 may be performed in a common etching process or in separate processes, and the depths of recesses 140 may be equal to or different from the depths of recesses 240.

Figure 5:
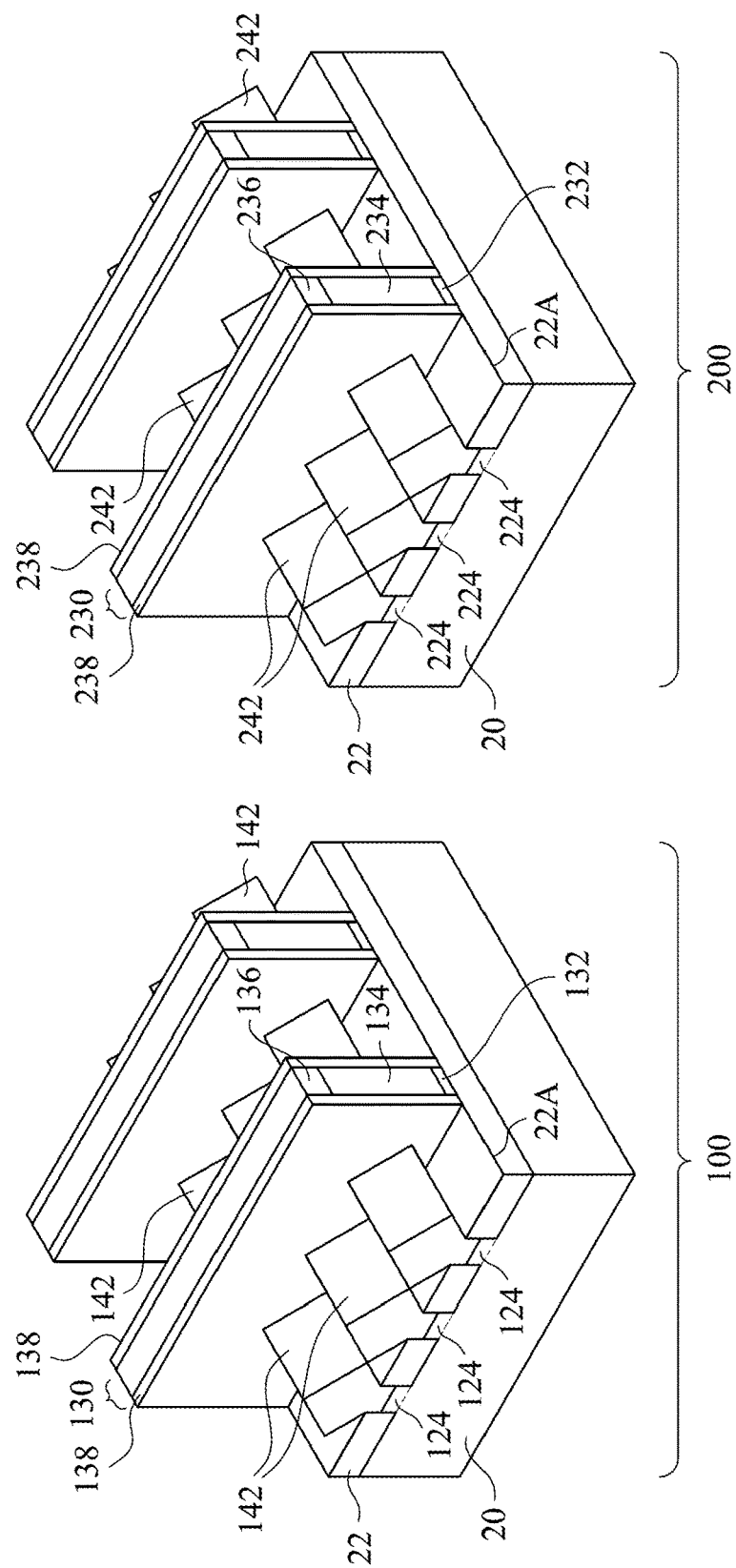

Next, epitaxy regions (source/drain regions) are formed by selectively growing a semiconductor material in recesses 140 and 240 simultaneously (or separately), resulting in the structure in FIG. 5. The respective step is illustrated as step 306 in the process shown in FIG. 17. In accordance with some exemplary embodiments, epitaxy regions 142 and 242 include silicon germanium or silicon. Depending on whether the resulting FinFETs are p-type FinFETs or n-type Fin-FETs, a p-type or an n-type impurity may be in-situ doped with the proceeding of the epitaxy. For example, when the resulting FinFETs are p-type FinFETs, silicon germanium boron (SiGeB) may be grown. Conversely, when the resulting FinFETs are n-type FinFETs, silicon phosphorous (SiP) or silicon carbon phosphorous (SiCP) may be grown. The concentration of the in-situ doped p-type or n-type impurity may be a higher than about $1 \times 10^{20}/cm^3$, and may be between about $1 \times 10^{20}/cm^3$, and about $2 \times 10^{21}/cm^3$ in accordance with some embodiments. In accordance with alternative embodiments of the present disclosure, epitaxy regions 142 and 242 are formed of a III-V compound semiconductor such as GaAs, InP, GaN, InGaAs, InAlAs, GaSb, AlSb, AlAs, AlP, GaP, combinations thereof, or multi-layers thereof. After recesses 140 and 240 are filled with the epitaxy semiconductor material, the further epitaxial growth of epitaxy regions 142 and 242 causes epitaxy regions 142 and 242 to expand horizontally, and facets may be formed. Neighboring epitaxy regions 142 and 242 may or may not be joined. Throughout the description, epitaxy regions 142 and 242 are referred to as source/drain regions.

Figure 6A:
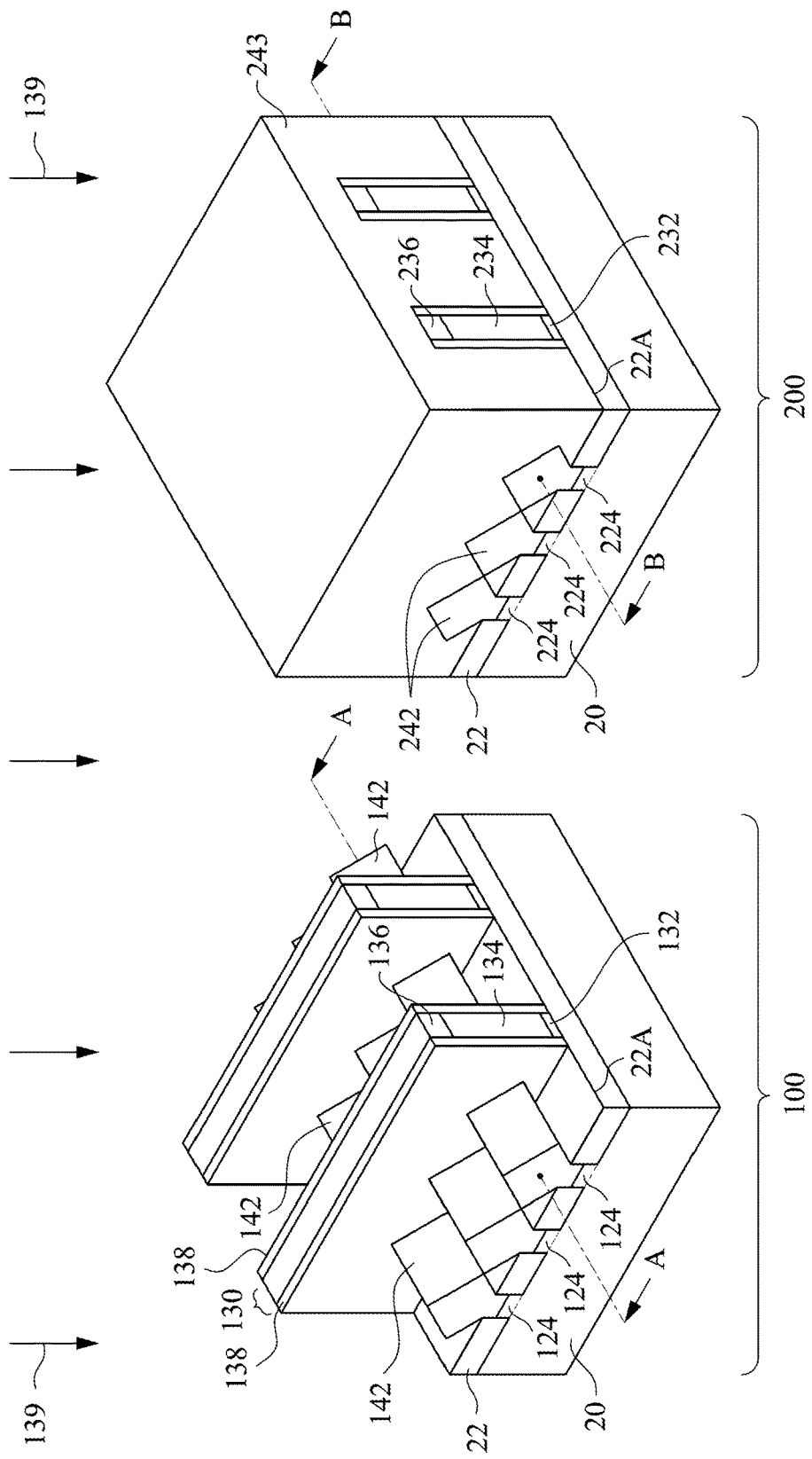

Referring to FIG. 6A, photo resist 243 is formed and patterned. Device region 200 is covered by photo resist 243, and device region 100 is not covered. Next, an implantation is performed to implant a p-type impurity or an n-type impurity. The respective step is illustrated as step 308 in the process shown in FIG. 17. The implantation is referred to as after-epi source/drain implantation. The implantation is represented by arrows 139. The implanted impurity has the same conductivity type as the in-situ doped impurity introduced in the step shown in FIG. 5. For example, if the resulting FinFETs in device regions 100 and 200 are of p-type, the implanted impurity is also p-type, and if the resulting FinFETs in device regions 100 and 200 are of n-type, the implanted impurity is also n-type. As a result of the implantation, the impurity concentration in source/drain regions 142 may be increased by two times to five times the impurity concentration of the in-situ doped impurity.

Figure 6B:
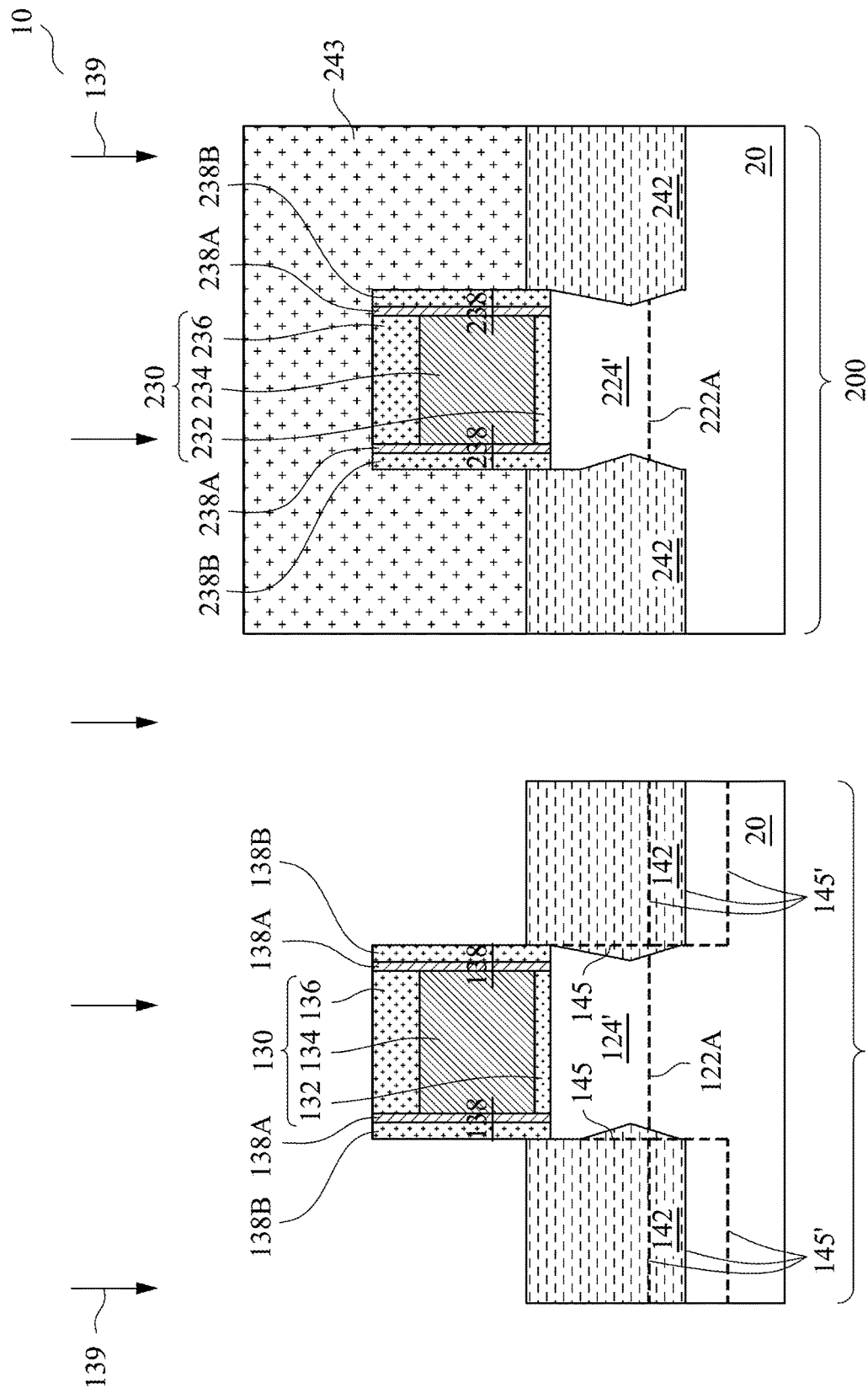

FIG. 6B illustrates the cross-sectional views of the structure shown in FIG. 6A, wherein the cross-sectional view includes the cross-sectional views obtained from the vertical plane containing line A-A and the vertical plane containing line B-B in FIG. 6A. In accordance with some embodiments, the implantation is performed vertically. The likely positions of the bottoms of the implanted regions 145 are marked as 145', which may be higher than, at the same level as, or lower than, the bottoms of epitaxy regions 142. Source/drain regions 242 are not implanted by any after-epi implantation due to photo resist 243. Since the implantation is performed using the same mask (gate stack 130 and spacers 138) as the etching shown in FIG. 4, the implanted regions 145 extend to both the inner edges and outer edges of source/drain regions 142. Phone resist 243 is removed after the implantation.

Figure 7A:
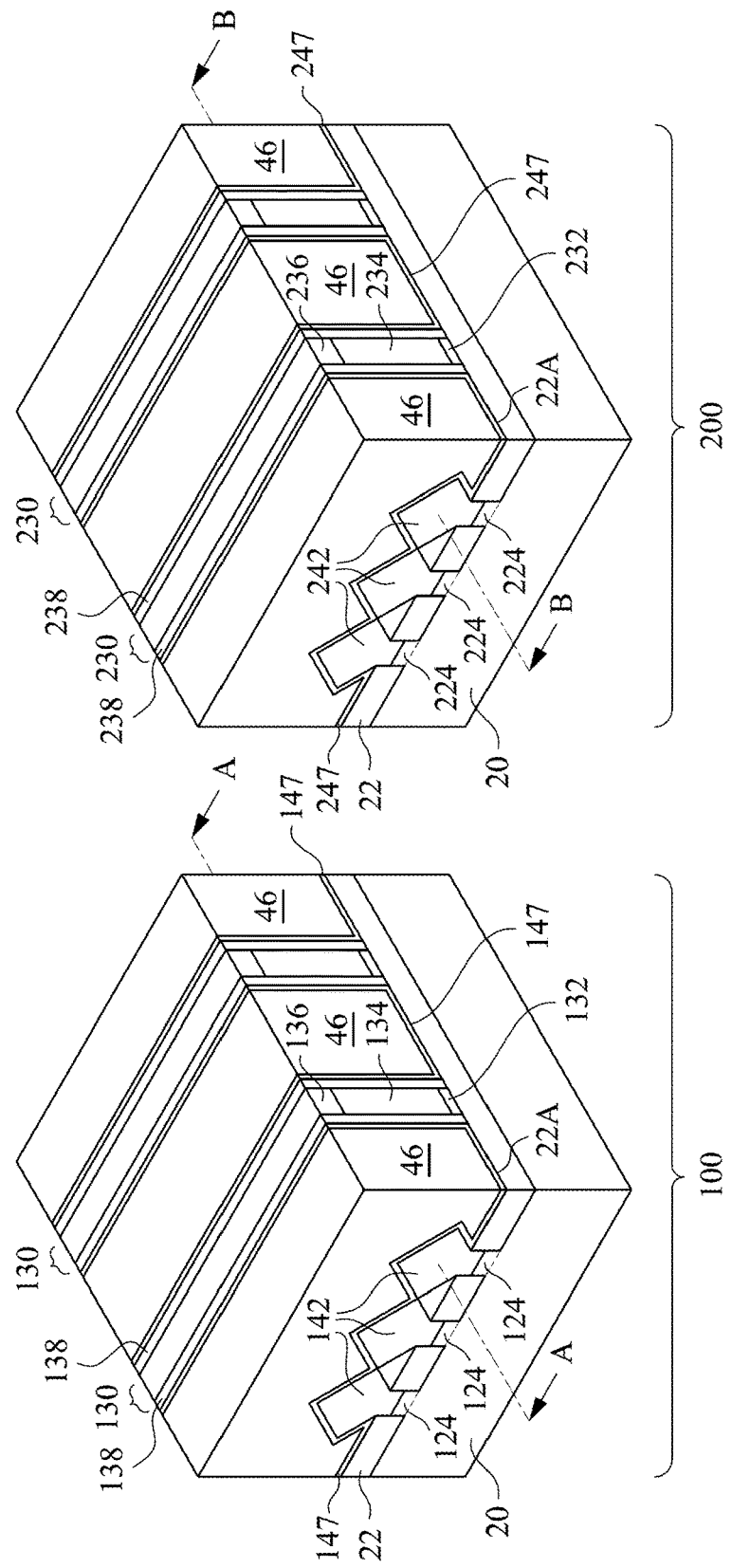

FIG. 7A illustrates a perspective view of forming Contact Etch Stop Layers (CESLs) 147 and 247 and Inter-Layer Dielectric (ILD) 46. The respective step is illustrated as step 310 in the process shown in FIG. 17. In accordance with some embodiments of the present disclosure, CESLs 147 and 247 are formed of silicon nitride, silicon carbo-nitride, or the like. CESLs 147 and 247 may be formed using a conformal deposition method such as ALD or CVD, for example. ILD 46 is formed over CESLs 147 and 247, and may be formed using, for example, FCVD, spin-on coating, CVD, or the like. ILD 46 may be formed of Phospho-Silicate Glass (PSG), Boro-Silicate Glass (BSG), Boron-Doped Phospho-Silicate Glass (BPSG), Tetra Ethyl Ortho Silicate (TEOS) oxide, or the like. A planarization such as Chemical Mechanical Polish (CMP) or grinding may be performed to level the top surfaces of ILD 46, dummy gate stacks 130 and 230, and gate spacers 138 and 238 with each other.

Figure 7B:
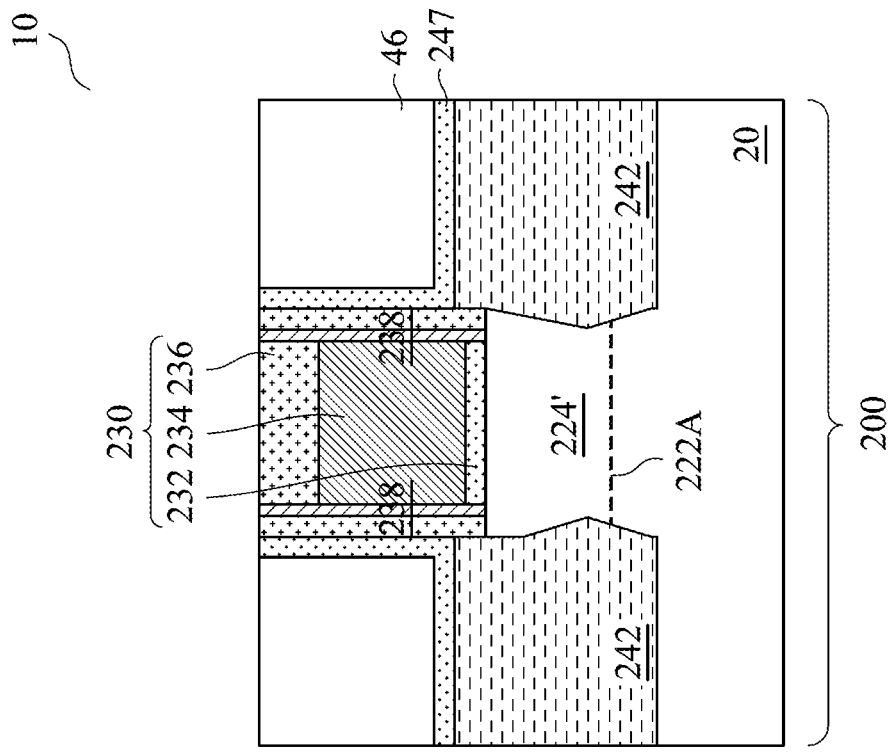
Figure 7B:
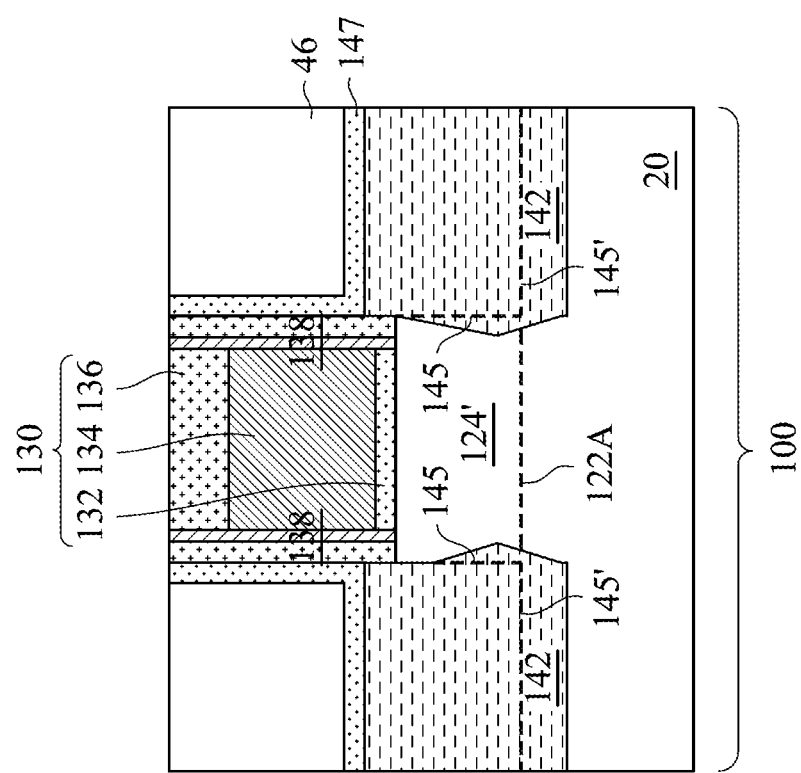
Figure 8:
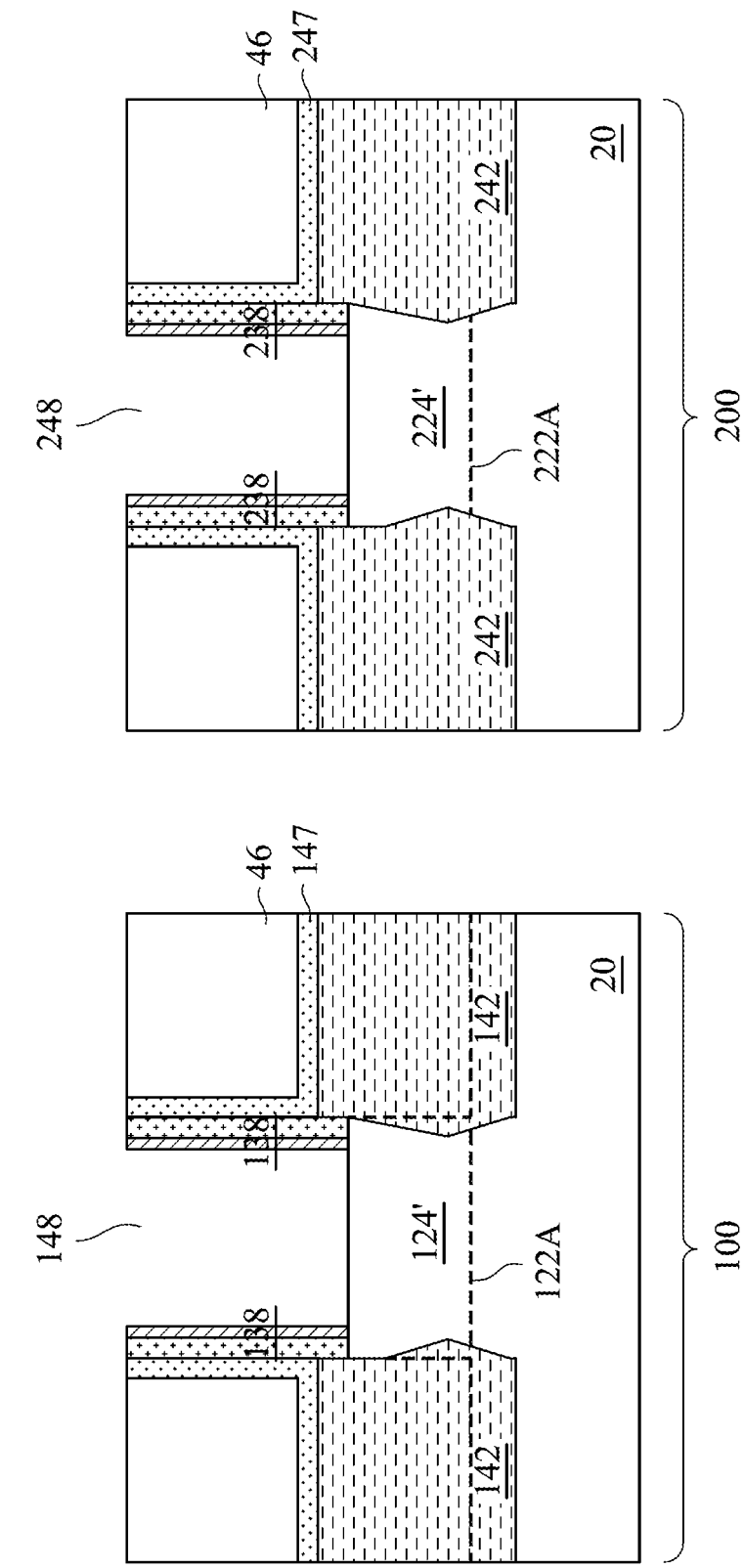
Figure 9:
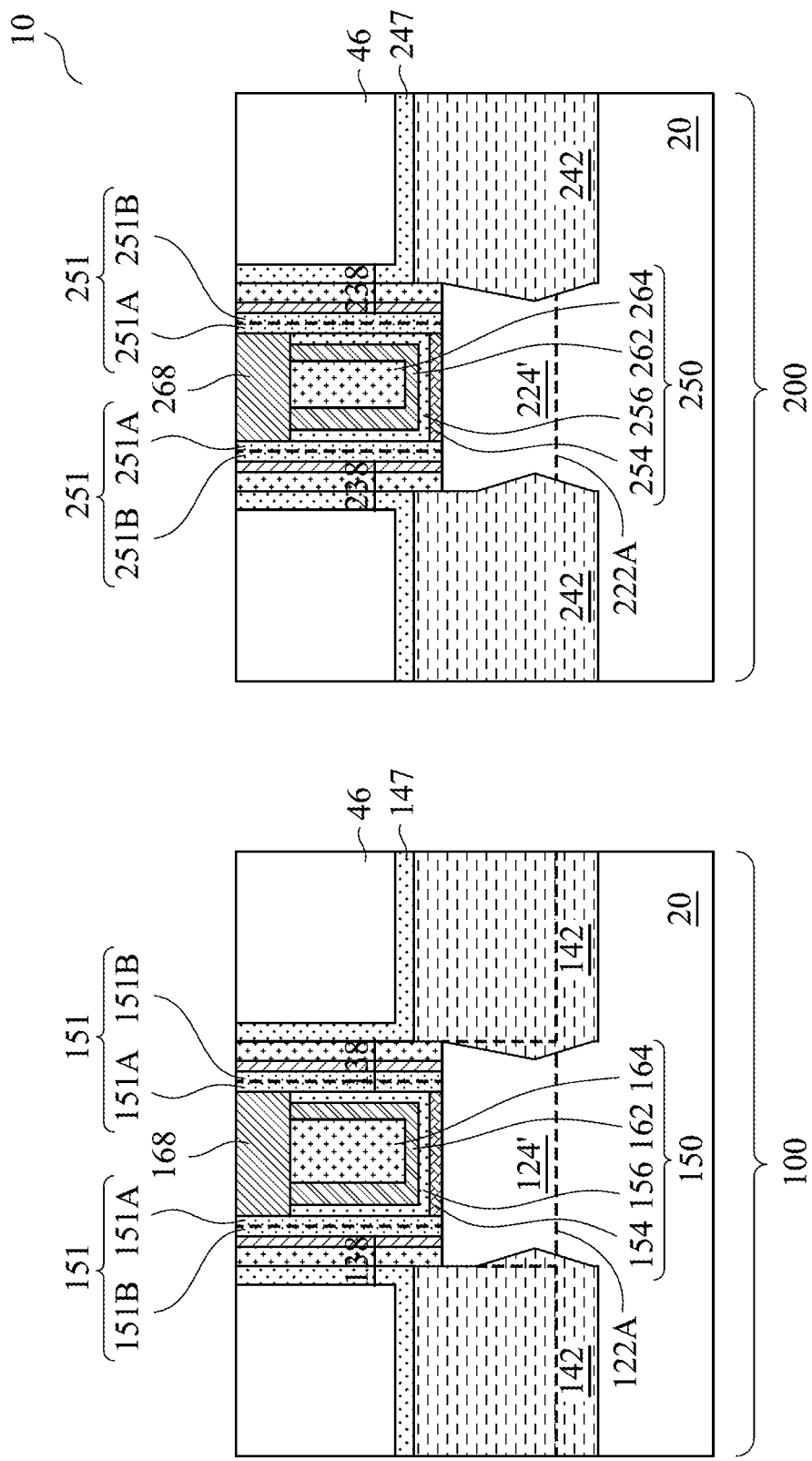

FIG. 7B illustrates the cross-sectional views of the structure shown in FIG. 7A, with the cross-sectional views being obtained from the vertical plane containing line A-A and the vertical plane containing line B-B in FIG. 7A. After the structure shown in FIGS. 7A and 7B is formed, the dummy gate stacks 130 and 230 including hard mask layers 136 and 236, dummy gate electrodes 134 and 234, and dummy gate dielectrics 132 and 232 are replaced with metal gates and replacement gate dielectrics, as shown in FIGS. 8 and 9. In FIGS. 6B, 7B, and FIGS. 8 through 15, the top surfaces 122A and 222A of STI regions 22 are illustrated, and protruding fins 124' and 224' protrude higher than top surfaces 122A and 222A, respectively.

To form the replacement gates, hard mask layers 136 and 236, dummy gate electrodes 134 and 234, and dummy gate dielectrics 132 and 232 as shown in FIGS. 7A and 7B are removed, forming openings 148 and 248 as shown in FIG. 8. The respective step is illustrated as step 312 in the process shown in FIG. 17. The top surfaces and the sidewalls of protruding fins 124' and 224' are exposed to openings 148 and 248, respectively.

Next, referring to FIG. 9, replacement gate stacks 150 and 250 are formed, and hard mask 152 and 252 are formed over gate stacks 150 and 250, respectively. The respective step is illustrated as step 314 in the process shown in FIG. 17. Replacement gate stacks 150 and hard mask 152 are between opposite gate spacers 138, and gate stacks 250 and hard mask 252 are between opposite gate spacers 238. Additional gate spacers 151 and 251 may (or may not) be formed in openings 148 and 248 (FIG. 8), respectively. The formation process is briefly discussed as follows.

In accordance with some embodiments, gate spacers 151 and 251 are formed lining the sidewalls of openings 151 and 251 first. In accordance with alternative embodiments, gate spacers 151 and 251 are not formed. To form gate spacers 151 and 251, a blanket gate spacer layer(s) may be formed, for example, using a deposition method such as ALD or CVD. The blanket gate spacer layer is conformal. In accordance with some embodiments of the present disclosure, the gate spacer layer is formed of silicon nitride (SiN), SiC, SiON, or the like. Gate spacers 151 and 251 separate the subsequently formed metal gates farther away from source/drain regions 142 and 242, and the possibility of leakage and electrical shorting between them are reduced. Gate spacers 151 may include low-k dielectric layer 151A, which may be formed of porous SiON, and dielectric layer 151B, which may be a high-k dielectric layer or has a k value substantially equal to 3.9 (and hence is neither a high-k nor a low-k dielectric material). The k value of low-k dielectric layer 151A may be between about 3.0 and about 3.5, for example. Gate spacers 251 may have the same structure as gate spacers 151, and hence may also include dielectric layer 251A formed of a same material as dielectric layer 151A, and dielectric layer 251B formed of a same material as dielectric layer 151B.

As also shown in FIG. 9, gate stacks 150 and 250 include gate dielectrics 154/156 and 254/256, which extend into openings 148 and 248, respectively. In accordance with some embodiments of the present disclosure, the gate dielectrics include Interfacial Layers (ILs) 154 and 254, which are formed on the exposed surfaces of protruding fins 124' and 224', respectively. Each of ILs 154 and 254 may include an oxide layer such as a silicon oxide layer, which is formed through the thermal oxidation of protruding fins 124' and 224', a chemical oxidation process, or a deposition process. The gate dielectrics may also include high-k dielectric layers 156 and 256 over the corresponding ILs 154 and 254. High-k dielectric layers 156 and 256 may be formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 20 or higher. High-k dielectric layers 156 and 256 are formed as conformal layers, and extend on the sidewalls of protruding fins 124' and 224' and the sidewalls of gate spacers 138/151 and 238/251, respectively.

In accordance with some embodiments of the present disclosure, high-k dielectric layers 156 and 256 are formed using ALD or CVD.

Further referring to FIG. 9, metal-containing conductive layers 162 and 262 are formed through deposition. The deposition may be performed using a conformal deposition method such as ALD or CVD, so that the horizontal thickness of the horizontal portions and vertical thickness of the vertical portions of metal-containing layer 162/262 (and each of sub-layers) have thicknesses substantially equal to each other. For example, the horizontal thickness and the vertical thickness may have a difference smaller than about 20 percent or 10 percent of either of the horizontal thickness and the vertical thickness.

Each of metal-containing layers 162 and 262 includes at least one layer, or may include a plurality of layers (not shown) formed of different materials. The corresponding layers in metal-containing conductive layers 162 and 262 may be formed in common deposition processes or separate deposition processes. The materials of the layers in metal-containing layers 162 and 262 may include work-function metals selected according to whether the respective FinFETs are n-type FinFETs or p-type FinFETs. For example, when the FinFETs are n-type FinFETs, each of metal-containing layers 162 and 262 may include a titanium nitride (TiN) layer, a tantalum nitride (TaN) layer, and an Al-based layer (formed of, for example, TiAl, TiAlN, TiAlC, TaAlN, or TaAlC), respectively. When the FinFETs are p-type FinFETs, each of metal-containing layers 162 and 262 may include a TiN layer, a TaN layer, and another TiN layer, respectively. Layers 162 and 262 may also include two layers or more than three layers.

A filling metal is then filled over layers 162 and 262 to form metal regions 164 and 264. In accordance with some exemplary embodiments, the filling metal includes W, Cu, Co. Al, Ru, or alloys thereof. After metal regions 164 and 264 are deposited, a planarization step such as CMP or mechanical grinding is performed to remove excess portions of the deposited layers over the top surface of ILD 46, and hence gate stacks 150 and 250 are formed.

Next, gate stacks 150 and 250 are recessed to form recesses, followed by filling a dielectric material into the recesses to form hard masks 168 and 268. Another planarization step is then performed to level to the top surfaces of hard masks 168 and 268 with the top surface of ILD 46. Hard masks 168 and 268 may be dielectric hard masks formed of silicon nitride, silicon oxynitride, silicon oxy-carbide, or the like.

Figure 10:
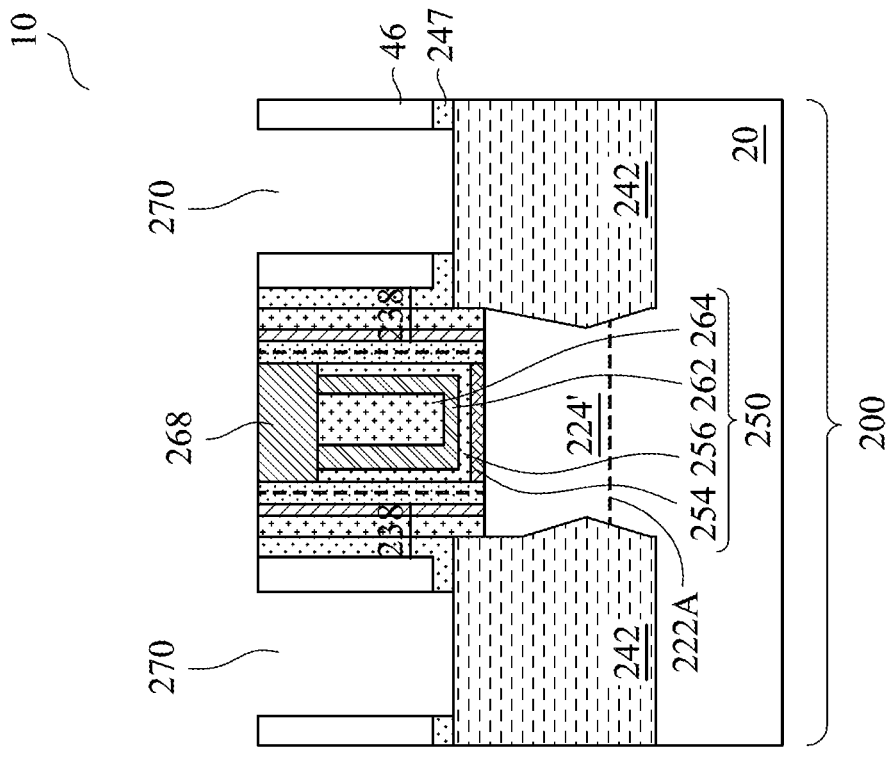
Figure 10:
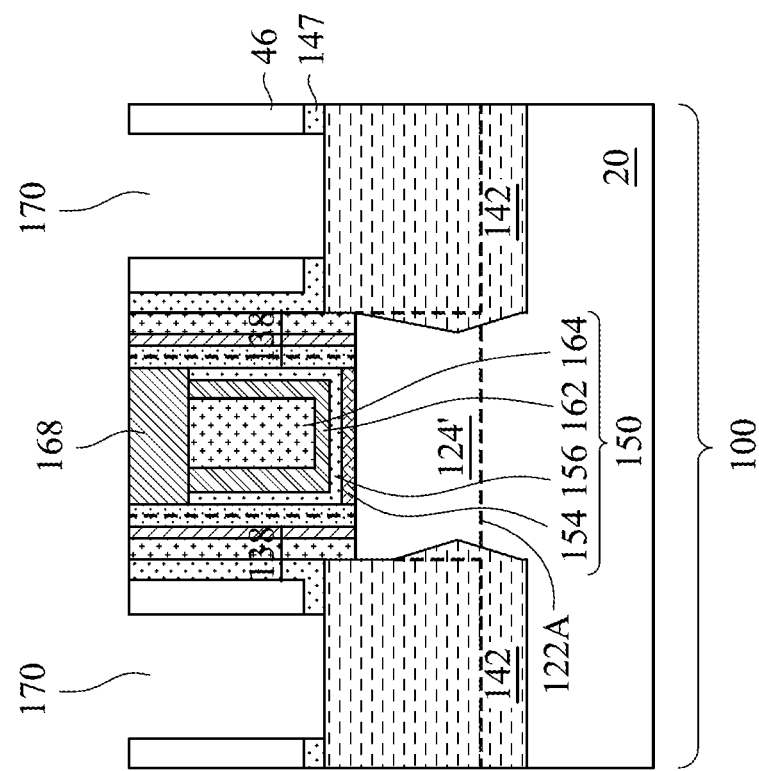
Figure 11:
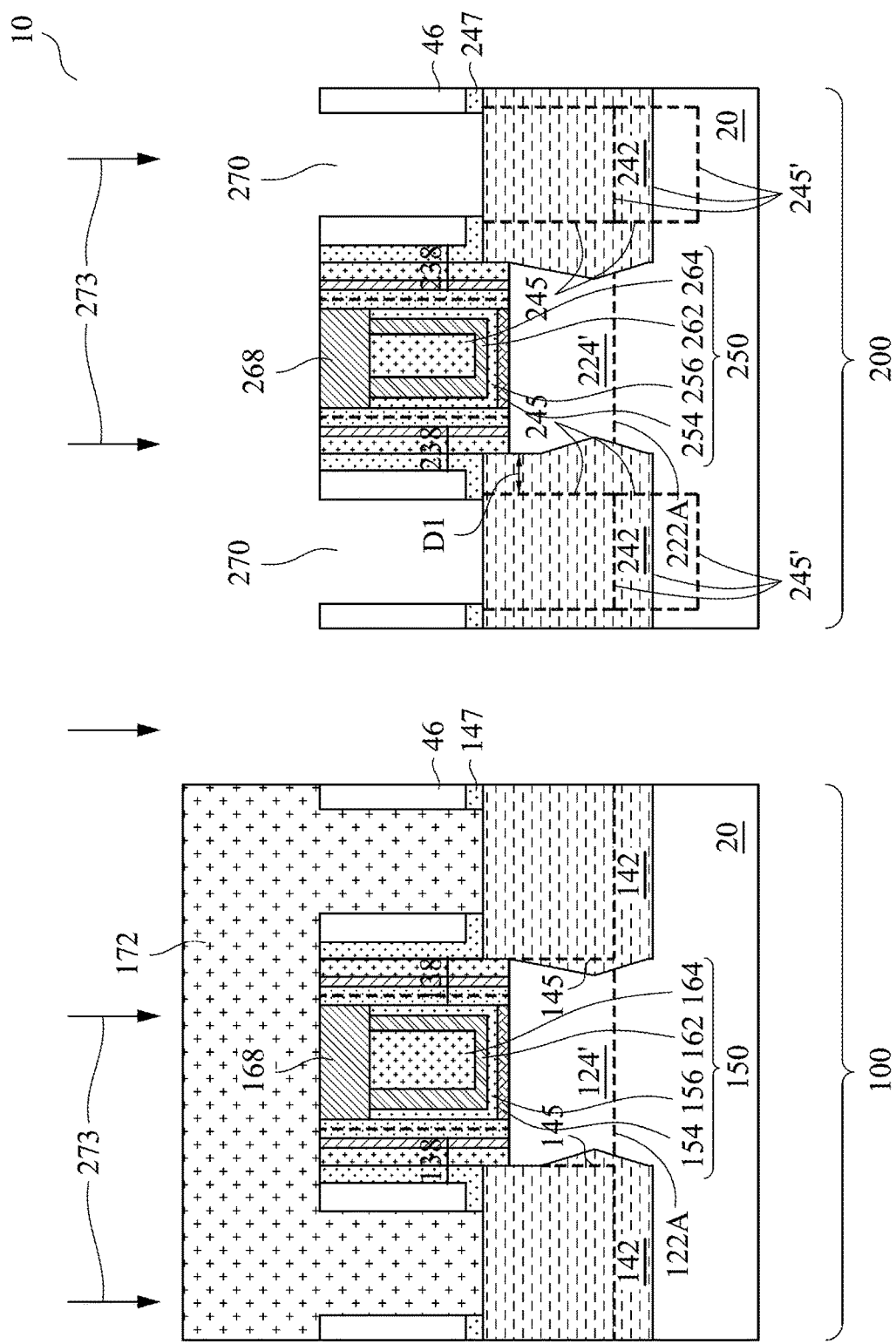
Figure 12:
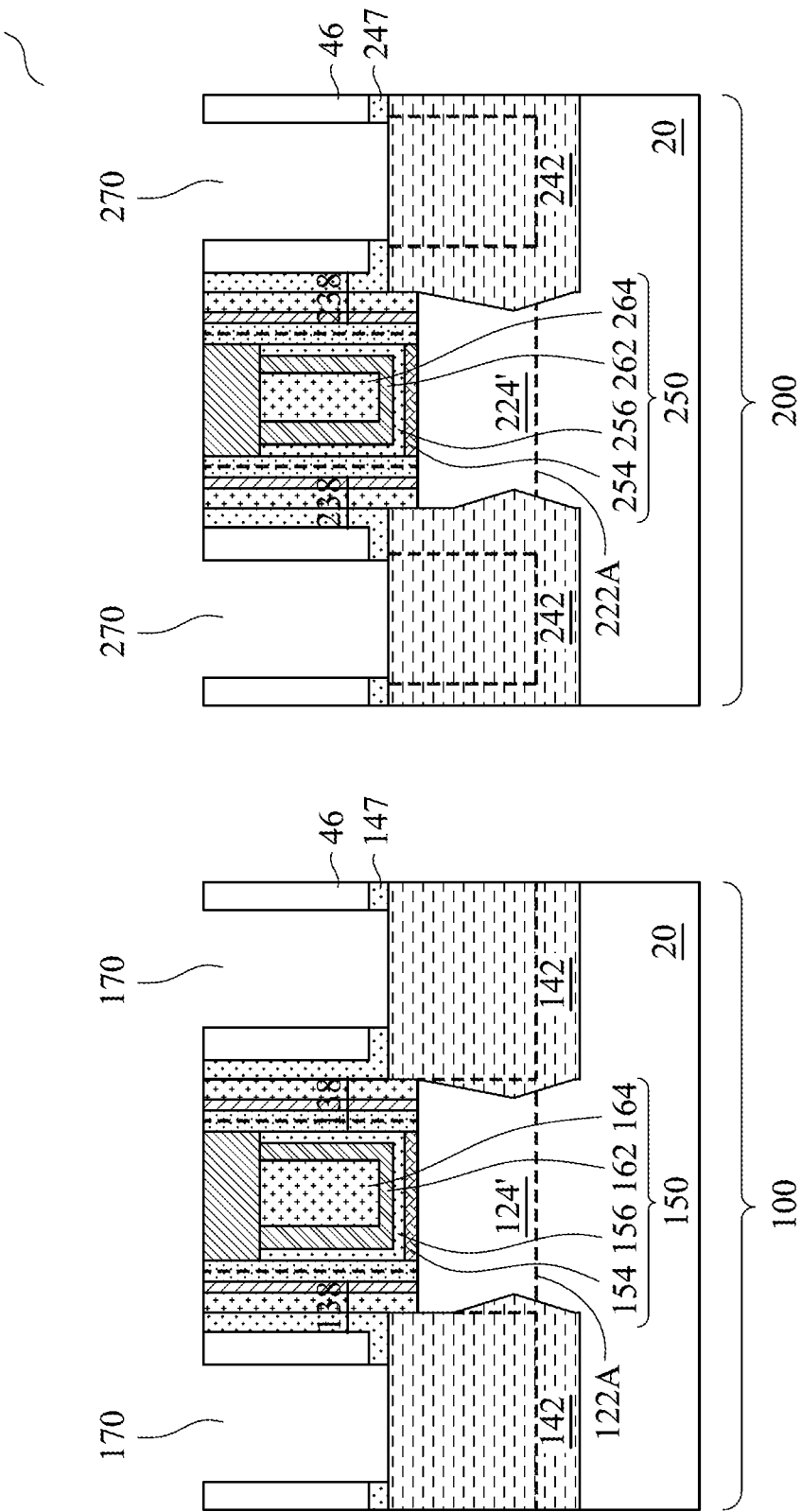

In a subsequent step, as shown in FIG. 10, ILD 46 and CESL 147 and 247 are etched to form contact openings 170 and 270. The respective step is illustrated as step 316 in the process shown in FIG. 17. Source/drain regions 142 and 242 are thus revealed. FIG. 11 illustrates the formation of photo resist 172 to cover device region 100, while leaving device region 200 uncovered. Next, an implantation is performed to implant a p-type impurity or an n-type impurity, which has the same conductivity type as the after-epi implantation as shown in FIGS. 6A and 6B. The implantation shown in FIG. 11 is referred to as after-contact source/drain implantation. The respective step is illustrated as step 318 in the process shown in FIG. 17. The implantation is represented by arrows 273. As a result of the implantation, the impurity concentration in the implanted regions 245 may be increased by two times to five times the impurity concentration of the in-situ doped impurity. The implantation may be performed vertically.

As shown in FIG. 11, contact openings 270 are spaced apart from gate spacers 238 by horizontal distance D1. Distance D1 has a non-zero value, which may be between about 5 nm and about 10 nm. Accordingly, the respective implanted regions 245 are spaced apart from the channel region of the respective transistor farther than the implanted regions 145 formed by the after-epi implantation as shown in FIGS. 6A and 6B. The likely positions of the bottoms of implanted regions 245 are marked as 245', which may be higher than, at the same level as, or lower than, the bottoms of epitaxy regions 242. Source/drain regions 142 are not implanted by any after-contact implantation due to photo resist 243. Photo resist 243 is then removed, resulting in the structure shown in FIG. 12.

Figure 13:
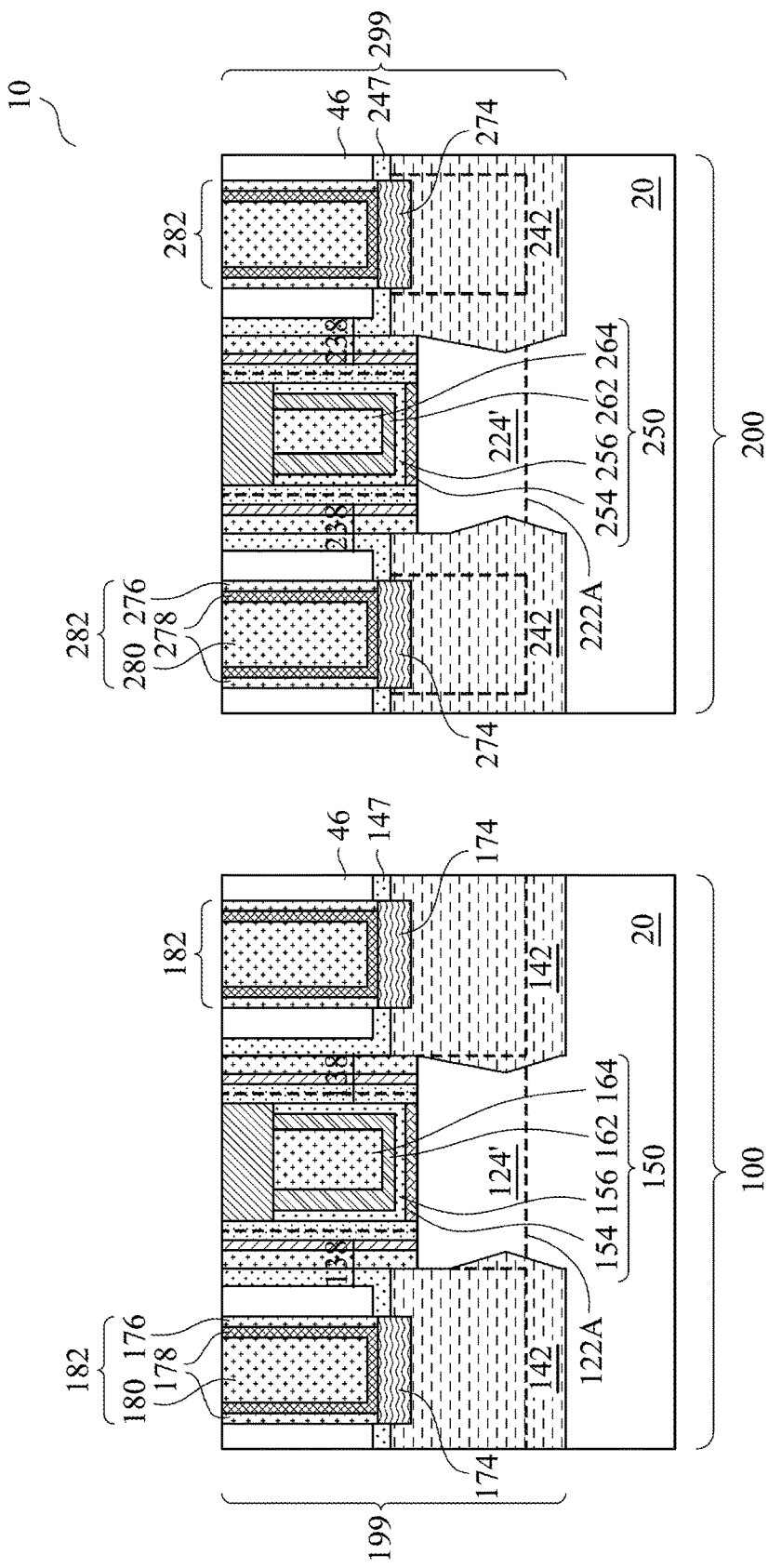

FIG. 13 illustrates the formation of source/drain silicide regions 174 and 274 and source/drain contact plugs 182 and 282. The respective step is illustrated as step 320 in the process shown in FIG. 17. In accordance with some embodiments, metal layers 176 and 276 (titanium layers, for example) are deposited as a blanket layer, followed by a nitridation process on the top portion of metal layers 176 and 276 to form metal nitride layers 178 and 278. The bottom portion of metal layers 176 and 276 are not nitridated. Next, an anneal (which may be rapid thermal anneal) is performed to react the metal layers 176 and 276 with the top portions of source/drain regions 142 and 242 to form silicide regions 174 and 274. The portions of metal layers 176 and 276 on the sidewalls of ILD 46 are not reacted. Metal regions 180 and 280 are then formed, for example, by filling tungsten, cobalt, or the like, followed by a planarization to remove excess materials, resulting in lower source/drain contact plugs 182 and 282. Contact plug 182 includes layers 176, 178, and 180, and contact plug 282 including layers 276, 278, and 280. Long-channel transistor 199 and short-channel transistor 299 are thus formed.

Figure 14:
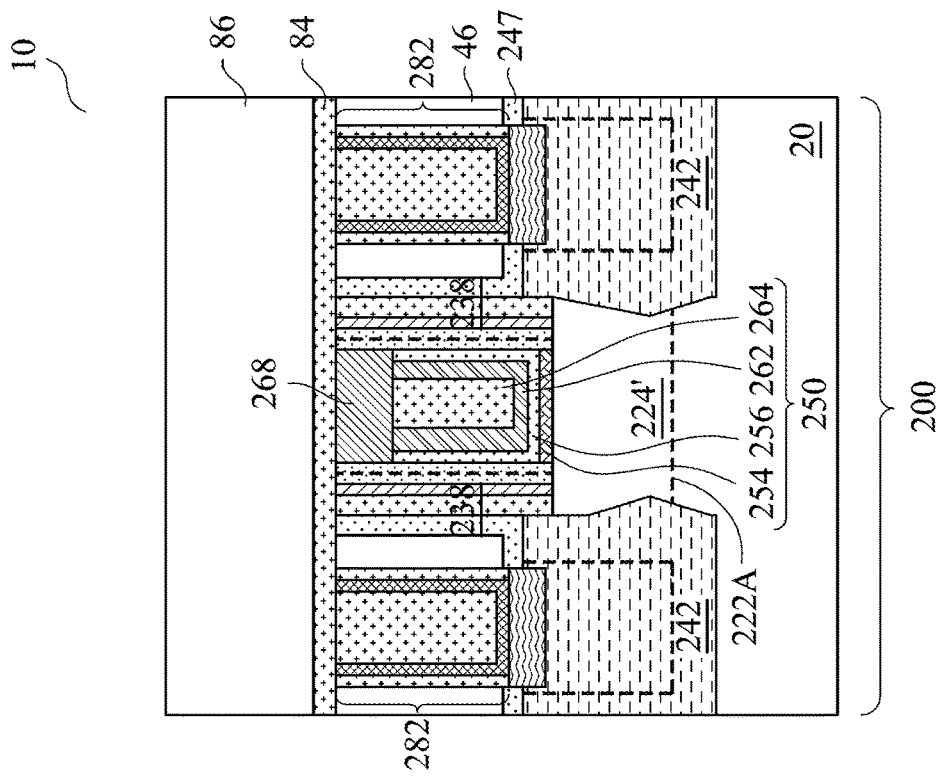
Figure 14:
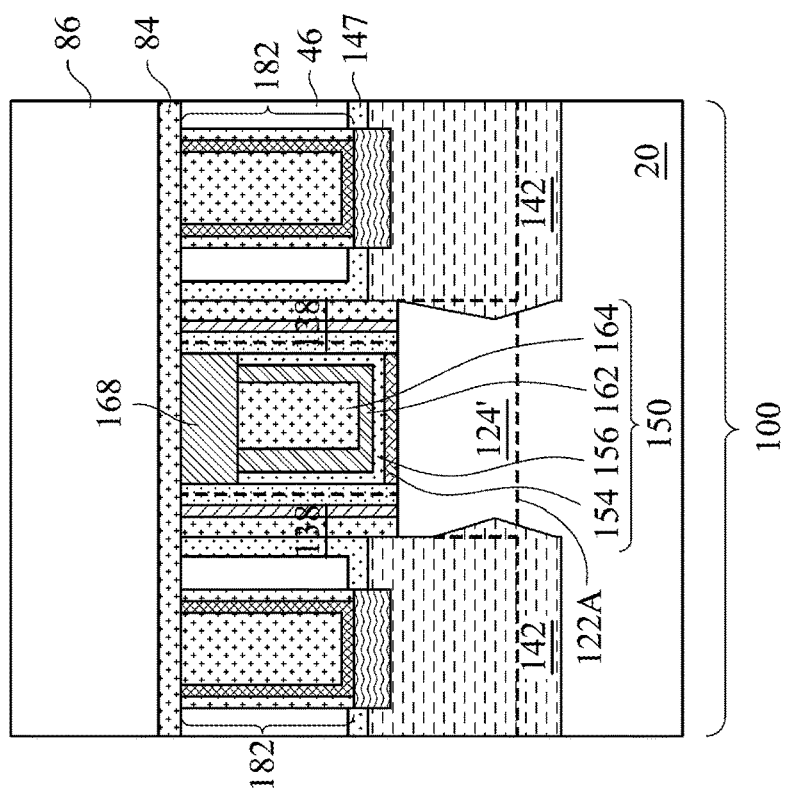

Referring to FIG. 14, etch stop layer 84 is formed. In accordance with some embodiments, etch stop layer 84 is formed of SiN, SiCN, SiC, SiOCN, or another dielectric material. The formation method may include PECVD, ALD, CVD, or the like. Next, ILD 86 is formed over etch stop layer 84. The material of ILD 86 may be selected from the same candidate materials (and methods) for forming ILD 46, and ILDs 46 and 86 may be formed of the same or different dielectric materials. In accordance with some embodiments, ILD 86 is formed using PECVD, FCVD, spin-on coating, or the like, and may include silicon oxide ($SiO_2$).

ILD 86 and etch stop layer 84 are etched to form openings (not shown). The etching may be performed using, for example, Reactive Ion Etch (RIE). In a subsequent step, as shown in FIG. 15, plugs/vias 188, 190, 288, and 290 are formed. In accordance with some embodiments of the present disclosure, plugs/vias 188, 190, 288, and 290 include barrier layers 92 and metal-containing material 94 over the barrier layers. In accordance with some embodiments of the present disclosure, the formation of plugs/vias 188, 190, 288, and 290 includes forming a blanket barrier layer 92 and a metal-containing material 94 over the blanket barrier layer, and performing a planarization to remove excess portions of the blanket barrier layer and the metal-containing material. Barrier layer 92 may be formed of a metal nitride such as titanium nitride or tantalum nitride. Metal-containing material 94 may be formed of tungsten, cobalt, copper, or the like. In accordance with some embodiments, dielectric contact spacers 196 and 296 are formed to encircle plugs/vias 188, 190, 288, and 290.

The embodiments of the present disclosure have some advantageous features. Since the transistor formed in device region 200 is a short-channel transistor, if the source/drain implantation is performed using after-epi implantation, the implanted impurity is closer to the channel, and is more likely to diffuse into the channel region to degrade the short-channel effect and Drain-Induced Barrier Lowering (DIBL) performance of the transistor. Accordingly, for the short-channel device in device region 200, after-contact implantation is performed, and after-epi implantation is not performed. Conversely, for the long-channel transistor in device region 100, for example, a SRAM transistor, the layout effect may cause the threshold voltage to be adversely increased. The after-epi implantation is closer to the channel of the respective transistor, and hence has the effect of reducing the threshold voltage and reducing channel resistance. Also, long-channel transistors suffer less from the short-channel effect and DIBL performance degradation caused by the diffusion of the implanted impurity into the channel region. In conventional processes, however, a source/drain implantation is performed simultaneously for long-channel transistors and short-channel transistors, and the device performance of long-channel transistors and short-channel transistors cannot be tuned.

In accordance with some embodiments of the present disclosure, a method includes forming a first gate stack on a sidewall and a top surface of a first portion of a first protruding fin, forming a second gate stack on a sidewall and a top surface of a first portion of a second protruding fin, etching a second portion of the first protruding fin and a second portion of the second protruding fin to form a first recess and a second recess, respectively, epitaxially growing a first source/drain region and a second source/drain region in the first recess and the second recess, respectively, and performing a first implantation on the first source/drain region without implanting the second source/drain region. After the first implantation, an ILD is formed to cover the first source/drain region and the second source/drain region. The method further includes forming a first contact opening and a second contact opening in the ILD to reveal the first source/drain region and the second source/drain region, and performing a second implantation on the second source/drain region without implanting the first source/drain region. The second implantation is performed through the second contact opening.

In accordance with some embodiments of the present disclosure, a method includes forming a first gate stack and a second gate stack on semiconductor regions, forming a first gate spacer on a sidewall of the first gate stack, forming a second gate spacer on a sidewall of the second gate stack, and forming a first source/drain region and a second source/drain region. The first source/drain region has an inner edge vertically substantially aligned to a sidewall of the first gate stack, and the second source/drain region has an inner edge substantially vertically aligned to a sidewall of the second gate stack. A first implantation is performed on the first source/drain region to generate a first implanted region, and the first implanted region has an inner edge vertically aligned to a sidewall of the first gate stack. An ILD is formed to cover the first source/drain region and the second source/drain region. A first contact opening and a second contact opening are formed in the ILD to reveal the first source/drain region and the second source/drain region. A second implantation is performed on the second source/drain region to generate a second implanted region. The second implanted region is spaced apart from the second gate spacer by a portion of the ILD.

In accordance with some embodiments of the present disclosure, a method includes forming a first transistor including forming a first gate stack, epitaxially growing a first source/drain region on a side of the first gate stack, and performing a first implantation to implant the first source/drain region. The method further includes forming a second transistor including forming a second gate stack, forming a second gate spacer on a sidewall of the second gate stack, epitaxially growing a second source/drain region on a side of the second gate stack, and performing a second implantation to implant the second source/drain region. An inter-layer dielectric is formed to cover the first source/drain region and the second source/drain region. The first implantation is performed before the inter-layer dielectric is formed, and the second implantation is performed after the inter-layer dielectric is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first gate stack on a sidewall and a top surface of a first portion of a first protruding fin;
   forming a second gate stack on a sidewall and a top surface of a first portion of a second protruding fin;
   etching a second portion of the first protruding fin and a second portion of the second protruding fin to form a first recess and a second recess, respectively;
   epitaxially growing a first source/drain region and a second source/drain region in the first recess and the second recess, respectively;
   performing a first implantation on the first source/drain region without implanting the second source/drain region;
   after the first implantation, forming an Inter-Layer Dielectric (ILD) to cover the first source/drain region and the second source/drain region;
   forming a first contact opening and a second contact opening in the ILD to reveal the first source/drain region and the second source/drain region; and
   performing a second implantation on the second source/drain region without implanting the first source/drain region, wherein the second implantation is performed through the second contact opening, and in the second implantation, a p-type impurity or an n-type impurity is implanted.

2. The method of claim 1, wherein the first source/drain region is a part of a first transistor, and the second source/drain region is a part of a second transistor, and the first transistor has a longer channel than the second transistor.

3. The method of claim 2 wherein the first transistor is a transistor in a Static Random Access Memory (SRAM) cell or an input-output circuit, and the second transistor is in a core circuit.

4. The method of claim 1 further comprising forming first gate spacers on sidewalls of the first gate stack and second gate spacers on sidewalls of the second gate stack, wherein the second contact opening is spaced apart from the second gate spacers by a portion of the ILD.

5. The method of claim 1, wherein the first implantation and the second implantation introduce impurities of a same conductivity type.

6. The method of claim 1, wherein both the first implantation and the second implantation are performed vertically.

7. The method of claim 1, wherein the second implantation results in an additional implanted region, and a bottom surface of the additional implanted region is higher than a bottom of the first source/drain region.

8. The method of claim 1, wherein the second implantation results in an additional implanted region, and a bottom surface of the additional implanted region is lower than a bottom of the first source/drain region.

9. The method of claim 1, wherein each of the first implantation and the second implantation comprises implanting a p-type impurity or an n-type impurity.

10. A method comprising:
forming a first gate stack and a second gate stack on semiconductor regions;
forming a first gate spacer on a sidewall of the first gate stack;
forming a second gate spacer on a sidewall of the second gate stack;
forming a first source/drain region and a second source/drain region, wherein the first source/drain region has an inner edge vertically substantially aligned to a sidewall of the first gate stack, and the second source/drain region has an inner edge substantially vertically aligned to a sidewall of the second gate stack;
performing a first implantation on the first source/drain region to generate a first implanted region, and the first implanted region has an inner edge vertically aligned to a sidewall of the first gate stack;
forming an Inter-Layer Dielectric (ILD) to cover the first source/drain region and the second source/drain region;
forming a first contact opening and a second contact opening in the ILD to reveal the first source/drain region and the second source/drain region; and
performing a second implantation on the second source/drain region to generate a second implanted region, wherein the second implanted region is spaced apart from the second gate spacer by a portion of the ILD, and the first implantation and the second implantation introduce impurities of a same conductivity type.

11. The method of claim 10, wherein the forming the first source/drain region and the second source/drain region comprises:
etching the semiconductor regions to form a first recess and a second recess, respectively; and
epitaxially growing the first source/drain region and the second source/drain region in the first recess and the second recess, respectively.

12. The method of claim 11 further comprising, when the first source/drain region and the second source/drain region are grown, in-situ doping an impurity.

13. The method of claim 10, wherein the first source/drain region is a portion of a first transistor, and the second source/drain region is a portion of a second transistor, and the first transistor is a transistor in a Static Random Access Memory (SRAM) cell or an input-output circuit, and the second transistor is in a core circuit.

14. The method of claim 10, wherein both the first implantation and the second implantation are performed vertically.

15. The method of claim 10, wherein in the first implantation, the second source/drain region is not implanted.

16. The method of claim 10, wherein in the second implantation, the first source/drain region is not implanted.

17. A method comprising:
forming a first transistor comprising:
forming a first gate stack;
epitaxially growing a first source/drain region on a side of the first gate stack; and
performing a first implantation to implant the first source/drain region;
forming a second transistor comprising:
forming a second gate stack;
epitaxially growing a second source/drain region on a side of the second gate stack; and
performing a second implantation to implant the second source/drain region, wherein each of the first implantation and the second implantation comprises implanting a p-type impurity or an n-type impurity; and
forming an inter-layer dielectric to cover the first source/drain region and the second source/drain region, wherein the first implantation is performed before the inter-layer dielectric is formed, and the second implantation is performed after the inter-layer dielectric is formed.

18. The method of claim 17 further comprising etching the inter-layer dielectric to form a contact opening, wherein the second implantation is performed through the contact opening.

19. The method of claim 17, wherein in the second implantation, the first source/drain region is not implanted.

20. The method of claim 17, wherein the first transistor has a longer channel than the second transistor.

* * * * *